(12) United States Patent
Zanetti et al.

(10) Patent No.: US 11,002,496 B2
(45) Date of Patent: May 11, 2021

(54) THERMAL CONDUCTION DEVICE AND ASSOCIATED HEAT DISSIPATION SYSTEM

(71) Applicant: Alstom Transport Technologies, Saint-Ouen (FR)

(72) Inventors: Adrien Zanetti, Villeurbanne (FR); Damien Blanchet, Blyes (FR); Gaetan Tuyeras, Veyssilieu (FR); Julien Ravot, Amberieu en Bugey (FR)

(73) Assignee: Alstom Transport Technologies, Saint-Ouen (FR)

( * ) Notice: Subject to any disclaimer, the term of this patent is extended or adjusted under 35 U.S.C. 154(b) by 87 days.

(21) Appl. No.: 16/355,120

(22) Filed: Mar. 15, 2019

(65) Prior Publication Data

US 2019/0285371 A1  Sep. 19, 2019

(30) Foreign Application Priority Data

Mar. 16, 2018  (FR) ...................................... 1852261

(51) Int. Cl.
*F28F 13/00* (2006.01)
*H05K 7/20* (2006.01)
*H01L 23/433* (2006.01)

(52) U.S. Cl.
CPC .......... *F28F 13/00* (2013.01); *H01L 23/4338* (2013.01); *H05K 7/2039* (2013.01); *F28F 2013/006* (2013.01); *F28F 2013/008* (2013.01)

(58) Field of Classification Search
CPC ..... F28F 13/00; H01L 23/4338; H05K 7/2039
USPC ...................................................... 165/80.2
See application file for complete search history.

(56) References Cited

U.S. PATENT DOCUMENTS

| 2004/0188062 | A1 | 9/2004 | Belady et al. | |
| 2005/0275500 | A1* | 12/2005 | Dietz | F25D 19/006 337/298 |
| 2007/0030656 | A1 | 2/2007 | Ross et al. | |
| 2010/0038066 | A1* | 2/2010 | Yang | F28F 13/00 165/185 |
| 2011/0165369 | A1* | 7/2011 | Vafai | B01L 3/502746 428/76 |
| 2013/0314202 | A1* | 11/2013 | Bolton | H01L 23/34 337/299 |

FOREIGN PATENT DOCUMENTS

| FR | 2967763 | * | 5/2012 |
| FR | 2967763 | A1 | 5/2012 |

OTHER PUBLICATIONS

Translated Specification—FR2967763A1.*
Translated specification FR 2,967,763 , published May 2012.*

* cited by examiner

*Primary Examiner* — Henry T Crenshaw
(74) *Attorney, Agent, or Firm* — Thompson Coburn LLP; Steven M. Ritchey

(57) ABSTRACT

This thermal conduction device intended to be installed between a first heat source part and a second heat dissipation part, comprises a male element comprising a protruding part relative to a base and a female element comprising an inner wall defining a housing for receiving the protruding part. The male element is configured to exert a radial force against the inner wall when the thermal conduction device is installed between the first heat source part and the second heat dissipation part so as to improve the thermal conduction between the male element and the female element.

9 Claims, 2 Drawing Sheets

THERMAL CONDUCTION DEVICE AND ASSOCIATED HEAT DISSIPATION SYSTEM

CROSS-REFERENCE

This claims the benefit of French Patent Application FR 18 52261, filed Mar. 16, 2018, which is incorporated herein in its entirety.

FIELD OF THE INVENTION

The present invention relates to a thermal conduction device intended to be installed between a first heat source part and a second heat dissipation or transport part.

The present invention also relates to an associated heat dissipation system.

BACKGROUND OF THE INVENTION

The heat source is for example an electrical or electronic device.

In the field of electrical or electronic systems, it is known to use printed circuit boards bearing components having a high heat dissipation, these printed circuit boards generally being mounted removably on fixed substrates. At this time to discharge the heat flow, heat dissipaters or heat sinks are mounted on the printed circuit boards that are associated with the components to be cooled by thermal conduction and that in general are metal parts with fins.

However, such heat sinks fastened on the printed circuit boards are often cumbersome, bulky and must be placed as close as possible to the components to be cooled, which means that the electrical systems equipped with such heat sinks are generally bulky and difficult to implement, in particular when they comprise several printed circuit boards arranged in parallel and associated with a same substrate.

Furthermore, known from US 2004/0188062 is a thermal conduction device intended to be positioned between a first heat source part and a second heat dissipation part. However, the quality of the thermal transfer between the first heat source part and the second heat dissipation part provided by such a thermal conduction device is not optimal. Thus, the cooling of the first heat source part provided by the thermal conduction device and the second heat dissipation part requires improvement. Furthermore, such a device wears out quickly, in particular when the device is inserted into a system intended to undergo vibrations and/or to be moved.

SUMMARY OF THE INVENTION

The invention aims to resolve these drawbacks by proposing a thermal conduction device providing an optimal thermal transfer, i.e., an optimal thermal conduction between a heat source part and a thermal dissipation part and the wear of which over time is reduced, while advantageously allowing easier installation/uninstallation of the device in an associated heat dissipation system.

To that end, the invention relates to a thermal conduction device intended to be installed between a first heat source part and a second heat dissipation part, the thermal conduction device comprising:
  a male element comprising a base intended to be in thermal contact with one of the first and second parts,
  a female element comprising a base plate intended to be in thermal contact with the other of the first and second parts,
  the male element comprising a protruding part relative to the base and the female element comprising an inner wall defining a housing for receiving the protruding part, the protruding part and the inner wall being able to be in a thermal exchange relationship, in which the male element is configured to exert a radial force against the inner wall when the thermal conduction device is installed between the first part and the second part so as to improve the thermal conduction between the male element and the female element.

Owing to the use of male and female elements exerting a radial force on one another, the thermal contact between the male and female elements is improved and therefore the thermal conduction provided by the thermal conduction device is optimal. Furthermore, this also makes it possible to guarantee axial locking of the male element relative to the female element and thus to limit any wear of the device related to a recurring movement of the male element relative to the female element.

According to specific embodiments, the invention has one or more of the following features, considered alone or according to any technically acceptable combination(s):
  the male element and the female element have different respective overall thermal expansion coefficients, such that when the temperature of the conduction device is above a predetermined threshold, the protruding part exerts the radial force against the inner wall;
  the protruding part is able to be moved in the receiving housing of the protruding part, along a central axis of the housing, by applying a compression force between the base and the base plate, such that the distance between the base and the base plate is able to be modified by applying the compression force;
  the protruding part is able to be moved in the receiving housing of the protruding part along a central axis of the housing, and the thermal conduction device comprises a pressing member able to exert a first bearing force, respectively a second bearing force opposite one another, on the male element and on the female element;
  the pressing member is a spring extending between the base and the base plate along the central axis;
  the device comprises a maintaining member forming a stop limiting the axial movement of the male element relative to the female element to a predetermined maximum value;
  the base and the protruding part together define a circumferential part and a central core of the male element, the circumferential part forming a receiving housing of the central core, the central core and the circumferential part having different respective thermal expansion coefficients, such that when the temperature of the conduction device is above a predetermined threshold, the central core exerts a radial force against the circumferential part;
  the circumferential part comprises a contact face with one of the first and second parts, the contact face comprising a central orifice where a first end of the central core emerges intended to be in contact with said one of the first and second parts;
  a first element, chosen from among the circumferential part and the central core, has a thermal expansion coefficient greater than the thermal expansion coefficient of the female element, such that when the temperature of the conduction device is above a predetermined threshold, the protruding part exerts the radial force against the inner wall.

The invention also relates to a heat dissipation system comprising a first heat source part and a second heat dissipation part, the system comprising a thermal conduction device installed between the first part and the second part, the thermal conduction device being as defined above.

BRIEF DESCRIPTION OF THE DRAWINGS

The invention will be better understood and other advantages thereof will appear more clearly in light of the following description, provided solely as a non-limiting example and done in reference to the appended drawings, in which.

DETAILED DESCRIPTION OF THE INVENTION

Figure 1:
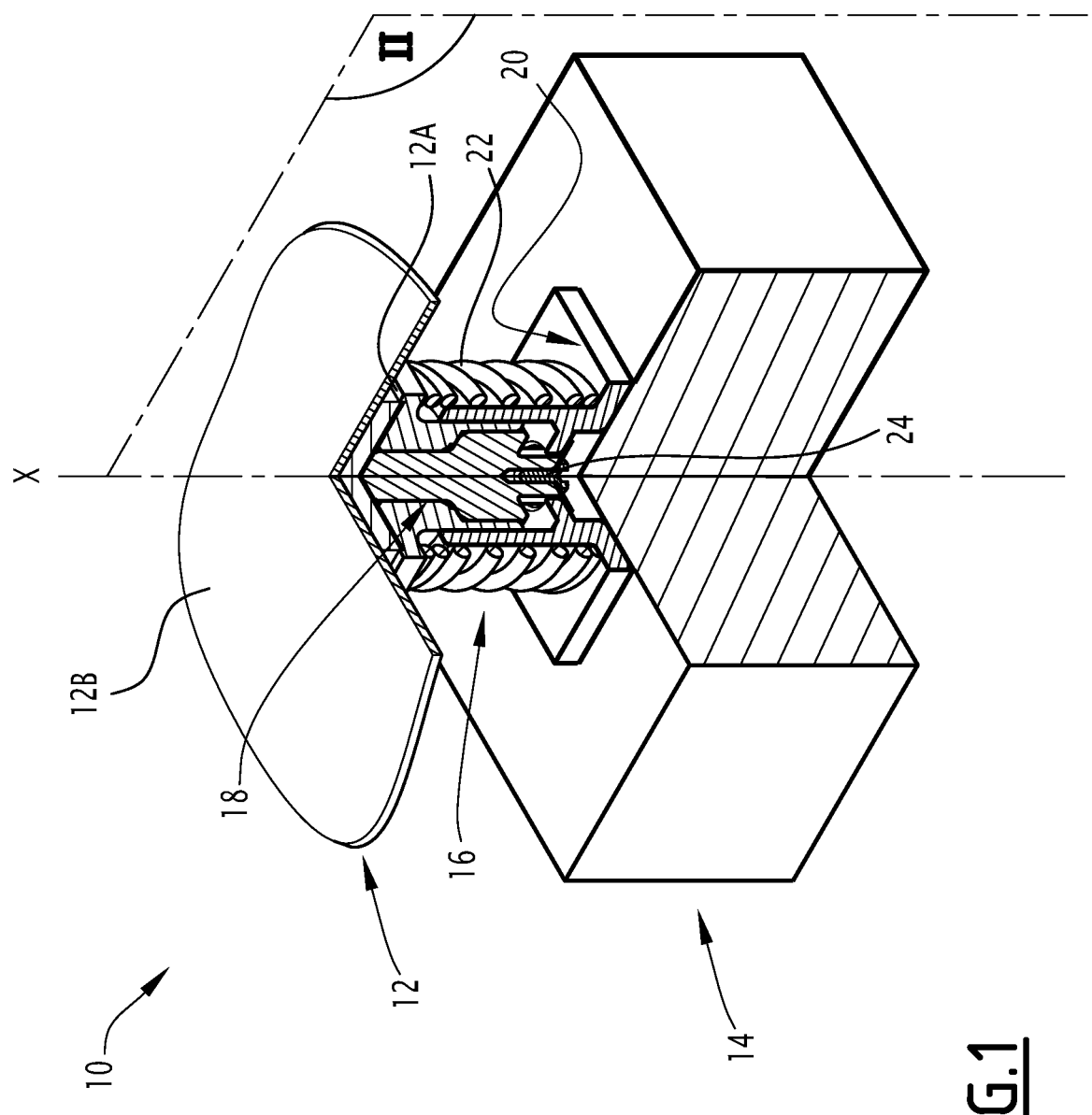
FIG. 1 is a partial three-dimensional illustration of a heat dissipation system according to the invention, comprising a thermal conduction device positioned between a first heat source part and a second heat dissipation part.

The heat dissipation system 10 visible in FIG. 1 is advantageously an electrical or electronic system and comprises a first heat source part 12 and a second heat dissipation part 14, between which a thermal conduction device 16 is installed.

The first part 12 is for example a processor 12A and in particular a printed circuit board 12B equipped with said processor 12A.

Advantageously, the printed circuit board 12B belongs to a communication antenna, in particular a communication antenna for communicating data between a railway vehicle and a piece of railway signaling equipment. Said antenna is intended to be installed on the railway vehicle, for example in a receiving tank of the antenna arranged in a traction box of the railway vehicle.

Alternatively, not shown, the first part 12 comprises a thermal collection element, such as a heat pipe or any other heat transfer device, mechanically connected to a printed circuit board.

The second part 14 is for example a heat exchanger, such as a thermal dissipater and in particular such as a cooling heat sink.

Advantageously, the second part 14 is a wall of the receiving tank of the antenna mentioned above.

The first part 12 and the second part 14 each have a fixed position relative to one another such that when the thermal conduction device 16 is positioned between the first part 12 and the second part 14, it is kept in position between the first and second parts.

Advantageously, the position of the first part 12 relative to the second part 14 is adjustable.

In the example of FIG. 1, the heat dissipation system 10 comprises a single printed circuit board 12B and a single heat exchanger 14.

However, alternatively, the heat dissipation system 10 comprises several first parts 12, for example several printed circuit boards in parallel with one another, and for each first part, an associated thermal conduction device 16 positioned between the first part and the heat exchanger 14. Thus, in this variant, the heat exchanger is pooled to cool multiple first parts 12.

The thermal conduction device 16 extends along a longitudinal axis X and comprises a male element 18 and a female element 20.

The male 18 and female 20 elements are advantageously movable relative to one another along the longitudinal axis X, the female element 20 at least partially receiving the male element 18.

The thermal conduction device 16 comprises a pressing member 22 able to exert a first bearing force E1, respectively a second bearing force E2 opposite one another, on the male element and on the female element. The first E1 and second E2 bearing forces are in particular exerted along the longitudinal axis X.

The thermal conduction device 16 also comprises a maintaining spring 24 forming a stop limiting the axial movement of the male element 18 relative to the female element 20 to a predetermined maximum value.

The maximum predetermined length is for example less than 60% of the length of the male element 18 measured along the longitudinal axis X.

Figure 2:
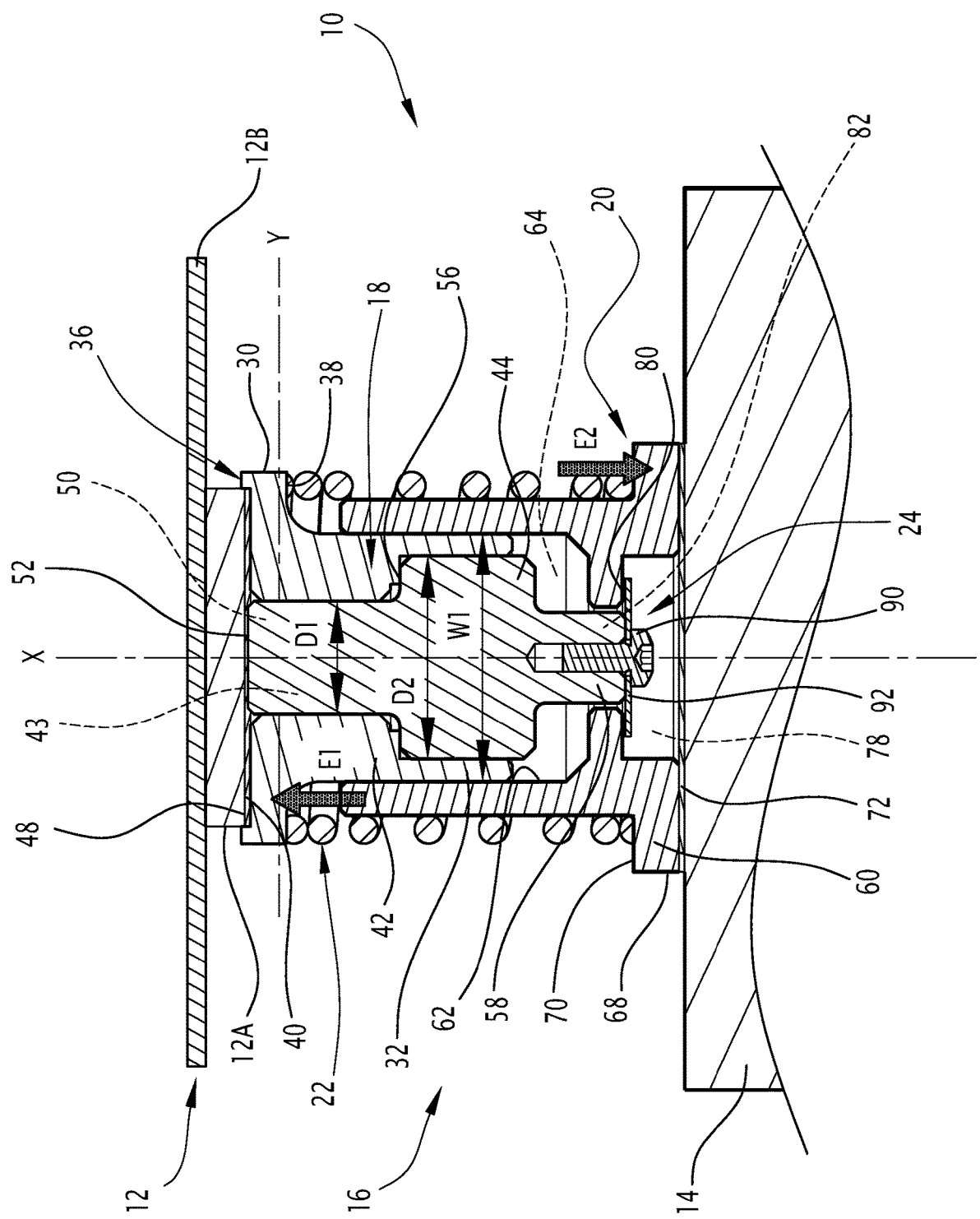
FIG. 2 is a partial sectional view of the heat dissipation system of FIG. 1, along plane II of FIG. 1.

The male element 18 comprises a base 30 intended to be in thermal contact with one of the first and second parts, and in particular with the first part 12 in the example of FIGS. 1 and 2. In one embodiment, this contact will be done via a thermal contact interface.

The male element 18 also comprises a protruding part 32 relative to the base 30, extending along a first central axis X1 of the male element.

In other words, the male element successively comprises, along the first central axis X1, the base 30 and the protruding part 32.

Advantageously, and as shown in FIG. 2, the first central axis X1 is combined with the longitudinal axis X. Thus, only the reference X is visible in FIG. 2.

The base 30 comprises, along the central axis X1, a first contact end 36 with one of the first and second parts, and in particular with the first part 12 in the example of FIGS. 1 and 2 and a first mechanical bearing end 38 on which the pressing member 22 is able to exert the first bearing force E1.

The first contact end 36 and the first mechanical bearing end 38 are opposite one another along the first central axis X1.

The first contact end 36 is at least partially covered with a layer 40 of thermal interface material. In one embodiment, this thermal interface could be a thermal paste having a thermal conductivity of between 0.5 and 11 W/m·k (the upper value not being limiting according to the embodiment), with a base of silicone or silver. In another embodiment, this thermal interface could be an orthotropic conductivity interface whose orthogonal conductivity is as high as possible without this detail being limiting in terms of performance or in terms of composition.

The layer 40 is sandwiched between the first contact end 36 and the first part 12 when the device is installed between the first part 12 and the second part 14.

The base 30 and the protruding part 32 together define, along a transverse axis Y perpendicular to the first central axis X1, a circumferential part 42 and a central core 44 of the male element.

The circumferential part 42 forms a housing 43 for receiving the central core 44, the housing 43 advantageously being a through housing along the central axis X1.

In FIG. 2, the circumferential part 42 is identified by diagonal lines, oriented from left to right going from bottom to top, having a first incline relative to the horizontal, and the central core 44 by diagonal lines, oriented from left to right going from bottom to top, having a second incline relative to the horizontal greater than the first incline.

In other words, the central core 44 is housed in the circumferential part 42.

Advantageously, the central core 44 is tightly snapped or sintered in the receiving housing 43 of the core.

The central core 44 is advantageously a solid part.

The circumferential part 42 comprises a contact face 48 with one of the first and second parts, and in particular with the first part 12 in the example of FIGS. 1 and 2. The contact face 48 comprises a central orifice 50 where a first end 52 of the central core 44 emerges, along the central axis X1, intended to be in contact with said one of the first and second parts, namely the first part 12 in the example of FIGS. 1 and 2.

The contact face 48 and the first end 52 of the central core form the first contact end 36 and are thus, as explained above, covered at least partially by the layer 40 of thermal interface material.

The receiving housing 43 of the central core comprises, along the central axis X1, starting from the base 30, a first cylindrical portion having a first diameter D1 and a second cylindrical portion having a second diameter D2 greater than the first diameter D1.

The first cylindrical portion and the second cylindrical portion are connected to one another by a transverse wall 56 forming a bearing stop of the central core 44 when the central core 44 is assembled with the circumferential part 42.

Advantageously, the value of the second diameter D2 is between 70% and 90% of the value of the maximum width W1 of the circumferential part measured along the transverse axis Y, at the second cylindrical portion.

The central core comprises, along the central axis X1, a first cylindrical part with a shape complementary to the first cylindrical portion and a second cylindrical part with a shape complementary to the second cylindrical portion.

Advantageously, the central core comprises a second end 58 opposite the first end 52 along the axis X1 and able to cooperate with the maintaining member 24.

The second end 58 advantageously forms a third cylindrical part with a diameter smaller than that of the second cylindrical part.

The female element 20 comprises a base plate 60 intended to be in thermal contact with the other of the first and second parts, namely the second part 14 in the example of FIG. 1.

The female element 20 comprises an inner wall 62 defining a housing 64 for receiving the protruding part 32 extending along a second central axis X2 of the female element.

The housing 64 protrudes relative to the base plate 60 along the central axis X2.

Advantageously, the second central axis X2 is combined with the first central axis X1 and in particular with the longitudinal axis X. Thus, only the reference X is visible in FIG. 2.

The male element 18 is assembled with the female element 20 such that the protruding part 32 is positioned in the receiving housing 64 of the protruding part.

Advantageously, a radial distance between the protruding part 32 and the inner wall 62 is smaller than or equal to 5 mm, preferably than 1 mm, in particular sufficient to allow the correct assembly of the male element in the female element, for temperatures greater than −20° C.

The base plate 60 comprises, along the central axis X2, a second contact end 68 with one of the first and second parts, and in particular with the second part 14 in the example of FIGS. 1 and 2, and a second mechanical bearing end 70 on which the pressing member 22 is able to exert the second bearing force E2.

The second contact end 68 and the second mechanical bearing end 70 are opposite one another along the second central axis X2.

The second contact end is at least partially covered with a layer 72 of thermal interface material, such as a thermal paste having a thermal conductivity of between 0.5 and 11 W/m·K, with a base of silicone or silver.

The thermal interface material is sandwiched between the second contact end 68 and the second part 14 when the device 16 is installed between the first part 12 and the second part 14.

The male 18 and female 20 elements advantageously being movable relative to one another, the protruding part 32 is able to be moved in the receiving housing 64 of the protruding part along the central axes X1, X2.

More specifically, the protruding part 32 is able to be moved in the receiving housing 64 of the protruding part, along a central axis of the housing, by applying a compression force between the base 30 and the base plate 60, such that the distance between the base and the base plate is able to be modified by applying the compression force.

The application of the compression force makes it possible to install/uninstall the thermal conduction device 16 easily in the heat dissipation system 10.

The compression force is advantageously greater than the first and second bearing forces.

The female element 20 defines an access orifice 78 from the outside of the device 16 to the maintaining member 24, advantageously arranged in a central portion of the base plate 60. The access orifice 78 passes through the second contact end 68 along the central axis X2.

Advantageously, the female element 20 comprises an inner radial wall 80 extending between the access orifice 78 and the receiving housing 64 of the protruding part.

The inner radial wall 80 comprises an orifice 82 connecting the access orifice 78 to the housing 64.

The second end 58 of the central core is for example positioned in the orifice 82 and receives the maintaining member 24.

More specifically, the maintaining member 24 comprises a retaining part 90 keeping the central core 44 secured to the second end 58 of the central core and a stop part 92 against the inner radial wall 80 positioned in the access orifice 78 and secured to the retaining part 90.

The retaining part 90 is for example a screw screwed into the second end 58 of the central core 44 and the stop part 92 is for example a washer associated with the screw, i.e., positioned between a head of the screw and a threaded shank of the screw.

The pressing member 22 is for example a spring, in particular helical, positioned between the first mechanical bearing end 38 and the second mechanical bearing end 70.

The operation of the conduction device and the thermal exchange relationships between the first 12 and second 14 parts via the device 16 will now be described.

The protruding part 32 and the inner wall 62 are able to be in a thermal exchange relationship, in particular due to the distance separating them.

The male element 18 is configured to exert a radial force against the female element 20 and in particular against the inner wall 62 when the conduction device 16 is installed between the first part 12 and the second part 14.

Advantageously, the male element 18 and the female element 20 have different respective overall thermal expansion coefficients, such that when the temperature of the conduction device 16 is above a predetermined threshold, the protruding part 32 exerts a radial force against the inner wall 62. Overall thermal expansion coefficient refers to a coefficient relative to the overall expansion of a part.

A ratio between the respective overall thermal expansion coefficients of the male 18 and female 20 elements is for example and purely as an example between 1.1 and 2, preferably between 1.3 and 1.8. Indeed, the choices of values of the thermal expansion coefficients remain dependent on the applications.

Such a characteristic makes it possible to improve the thermal exchanges between the male element and the female element 20 and thus to guarantee an optimized thermal conduction making it possible to effectively discharge the heat flow coming from the first part 12 toward a dissipater.

This also makes it possible to guarantee axial locking of the male element 18 relative to the female element 20 and thus to limit any wear of the device, in particular in a vibrating environment, related to a recurring movement of the male element relative to the female element. Such a movement may in particular occur when the system 10 is on board a vehicle.

Furthermore, the difference in thermal expansion coefficient makes it possible, on the one hand when the heat source 12 is operating and gives off heat, to guarantee the axial locking of the male element 18 relative to the female element 20, but also, on the other hand, when the heat source 12 is no longer operating and no longer generating heat, to guarantee unlocking of the position of the male element 18 relative to the female element 20 and thus to facilitate the removal of the thermal conduction device 16 from the system 10.

The predetermined threshold is determined in light of maintenance operations and the operating temperature of the heat dissipation system.

Alternatively, the thermal conduction device 16 comprises a deformation element of the male element capable of deforming the male element 18, so as to generate the radial force. The deformation element for example comprises a screw able to be screwed into the central core 44 and deform it or a pressing element capable of exerting a pressing force on the male element 18 in order to deform it in a radial direction.

Advantageously, the central core 44 and the circumferential part 42 have different respective thermal expansion coefficients, such that when the temperature of the conduction device 16 is above a predetermined threshold, the central core 44 exerts a radial force against the circumferential part 42, which is then able, due to its deformation related to the radial force, to exert a radial force against the female element 20 and in particular the inner wall 62.

According to another variant, a first element, chosen from among the circumferential part 42 and the central core 44, has a thermal expansion coefficient greater than the thermal expansion coefficient of the female element 20, such that when the temperature of the conduction device 16 is above a predetermined threshold, the protruding part 32 and in particular the circumferential part 42 exerts the radial force against the inner wall 62.

The thermal conductivity of the central core 44 is preferably greater than the thermal conductivity of the circumferential part 42, and the central core 44 has a thermal expansion coefficient greater than the thermal expansion coefficient of the circumferential part 42.

Advantageously, the circumferential part 42 and the female element 20 have substantially identical respective thermal expansion coefficients.

The central core 44 and the circumferential part 42 are made from a different material chosen for example from the following list: copper, bronze, aluminum, zamak or any other alloy of such materials.

When the device 16 is installed between the first part 12 and the second part 14, the pressing member 22 is compressed and exerts the first bearing force on the base and the second bearing force on the base plate. This makes it possible to keep the device in position relative to the first and second parts and to guarantee thermal contact and therefore optimal thermal exchanges between, on the one hand, the base 30 and the first part 12, and on the other hand, the base plate 60 and the second part 14.

Furthermore, the fact that the male and female elements are movable relative to one another makes it possible to adapt the length of the conduction device 16 to the space between the first 12 and second 14 parts.

The embodiments and alternatives considered above can be combined with one another to create new embodiments of the invention.

The invention claimed is:

1. A thermal conduction device intended to be installed between a first heat source part and a second heat dissipation part, the thermal conduction device comprising:
    a male element comprising (a) a base intended to be in thermal contact with one of the first heat source part and the second heat dissipation part and (b) a protruding part relative to the base;
    a female element comprising (a) a base plate intended to be in thermal contact with the other of the first heat source part and the second heat dissipation part and (b) an inner wall defining a housing for receiving the protruding part, such that the protruding part and the inner wall are able to be in a thermal exchange relationship;
  wherein the male element is configured to exert a radial force against the inner wall when the thermal conduction device is installed between the first heat source part and the second heat dissipation part so as to improve the thermal conduction between the male element and the female element; and
    wherein the male element and the female element have different overall thermal expansion coefficients, such that when the temperature of the conduction device is above a predetermined threshold, the protruding part exerts the radial force against the inner wall.

2. The thermal conduction device according to claim 1, wherein the protruding part is able to be moved in the housing for receiving the protruding part, along a central axis of the housing, by applying a compression force between the base and the base plate, such that the distance between the base and the base plate is able to be modified by applying the compression force.

3. The thermal conduction device according to claim 1, wherein the protruding part is able to be moved in the housing for receiving the protruding part, along a central axis of the housing, and
    wherein the thermal conduction device further comprises a pressing member able to exert a first bearing force on the male element and a second bearing force on the female element, wherein the first bearing force and the second bearing force are opposite one another.

4. The thermal conduction device according to claim 3, wherein the pressing member is a spring extending between the base and the base plate along the central axis.

5. The thermal conduction device according to claim 2, further comprising a maintaining member forming a stop limiting the axial movement of the male element relative to the female element to a predetermined maximum value.

6. The thermal conduction device according to claim 1, wherein the male element further comprises a circumferential part and a central core, the circumferential part forming a housing for receiving the central core, the central core and the circumferential part having different respective thermal expansion coefficients, such that when the temperature of the conduction device is above a predetermined threshold, the central core exerts a radial force against the circumferential part.

7. The thermal conduction device according to claim 6, wherein the circumferential part comprises a contact face with one of the first heat source part and the second heat dissipation part, the contact face comprising a central orifice where a first end of the central core emerges intended to be in contact with said one of the first heat source part and the second heat dissipation parts.

8. The thermal conduction device according to claim 6, wherein a first element, chosen from among the circumferential part and the central core, has a thermal expansion coefficient greater than the thermal expansion coefficient of the female element, such that when the temperature of the conduction device is above a predetermined threshold, the protruding part exerts the radial force against the inner wall.

9. A heat dissipation system comprising a first heat source part, a second heat dissipation part, a thermal conduction device installed between the first heat source part and the second heat dissipation part, wherein the thermal conduction device comprises:
 a male element comprising (a) a base intended to be in thermal contact with one of the first heat source part and the second heat dissipation part and (b) a protruding part relative to the base;
 a female element comprising (a) a base plate intended to be in thermal contact with the other of the first heat source part and the second heat dissipation part and (b) an inner wall defining a housing for receiving the protruding part, such that the protruding part and the inner wall are able to be in a thermal exchange relationship;
wherein the male element is configured to exert a radial force against the inner wall when the thermal conduction device is installed between the first heat source part and the second heat dissipation part so as to improve the thermal conduction between the male element and the female element; and
 wherein the male element and the female element have different overall thermal expansion coefficients, such that when the temperature of the conduction device is above a predetermined threshold, the protruding part exerts the radial force against the inner wall.

* * * * *